United States Patent
Chehade et al.

(10) Patent No.: US 12,120,846 B2
(45) Date of Patent: Oct. 15, 2024

(54) IMMERSION COOLING SYSTEMS FOR ELECTRONIC COMPONENTS

(71) Applicant: OVH, Roubaix (FR)

(72) Inventors: Ali Chehade, Moncheaux (FR); Gregory Francis Louis Bauchart, Wattrelos (FR); Alexandre Alain Jean-Pierre Meneboo, Harnes (FR)

(73) Assignee: OVH, Roubaix (FR)

( * ) Notice: Subject to any disclaimer, the term of this patent is extended or adjusted under 35 U.S.C. 154(b) by 20 days.

(21) Appl. No.: 17/694,765

(22) Filed: Mar. 15, 2022

(65) Prior Publication Data
US 2022/0322576 A1 Oct. 6, 2022

(30) Foreign Application Priority Data

Apr. 1, 2021 (EP) ..................................... 21305427
Aug. 30, 2021 (EP) ..................................... 21306172

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20236* (2013.01); *H05K 7/20281* (2013.01)

(58) Field of Classification Search
None
See application file for complete search history.

(56) References Cited

U.S. PATENT DOCUMENTS

| | | | |
|---|---|---|---|
| 2,115,501 A | 4/1938 | Sergius | |
| 2,316,296 A | 4/1943 | Simonds | |
| 3,938,689 A | 2/1976 | de Munnik | |
| 4,279,966 A | 7/1981 | Wakana et al. | |
| 4,619,316 A | 10/1986 | Nakayama et al. | |

(Continued)

FOREIGN PATENT DOCUMENTS

| | | |
|---|---|---|
| CN | 103687443 A | 3/2014 |
| CN | 106681459 A | 5/2017 |

(Continued)

OTHER PUBLICATIONS

Office Action with regard to the counterpart U.S. Appl. No. 17/697,264 mailed Nov. 22, 2023.

(Continued)

*Primary Examiner* — Courtney L Smith
(74) *Attorney, Agent, or Firm* — BCF LLP (57) ABSTRACT

A cooling system (50) including an immersion case, a bladder and a controller is disclosed. The immersion case (54) is configured to house an immersion cooling liquid, and an electronic component (80) configured to be submerged in the immersion cooling liquid. The bladder (56) is configurable between an expanded state and a contracted state and positioned such that the bladder (56) can be at least partially submerged in the immersion cooling liquid when in any one of the expanded state and the contracted state. The controller (58) is connected to the bladder (56) for modulating the bladder (56) between the expanded state and the contracted state to modulate a fluid level of the immersion cooling liquid in the immersion case (54).

18 Claims, 5 Drawing Sheets

(56) References Cited

U.S. PATENT DOCUMENTS

| | | |
|---|---|---|
| 4,888,664 A | 12/1989 | Rojc |
| 5,268,814 A | 12/1993 | Yakubowski |
| 5,307,956 A | 5/1994 | Richter et al. |
| 5,669,524 A | 9/1997 | Loedel |
| 5,907,473 A | 5/1999 | Przilas et al. |
| 6,023,934 A | 2/2000 | Gold |
| 6,746,388 B2 | 6/2004 | Edwards et al. |
| 6,847,525 B1 | 1/2005 | Smith et al. |
| 6,883,593 B2 | 4/2005 | Johnson et al. |
| 6,899,164 B1 | 5/2005 | Li et al. |
| 7,369,410 B2 | 5/2008 | Chen et al. |
| 7,403,392 B2 | 7/2008 | Attlesey et al. |
| 7,414,845 B2 | 8/2008 | Attlesey et al. |
| 7,527,085 B2 | 5/2009 | Ijima et al. |
| 7,724,517 B2 | 5/2010 | Attlesey et al. |
| 7,885,070 B2 | 2/2011 | Campbell et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey et al. |
| 8,014,150 B2 | 9/2011 | Campbell et al. |
| 8,089,764 B2 | 1/2012 | Attlesey |
| 8,089,765 B2 | 1/2012 | Attlesey |
| 8,089,766 B2 | 1/2012 | Attlesey |
| 8,291,964 B2 | 10/2012 | Hwang et al. |
| 8,305,759 B2 | 11/2012 | Attlesey et al. |
| 8,467,189 B2 | 6/2013 | Attlesey |
| 8,619,425 B2 | 12/2013 | Campbell et al. |
| 8,654,529 B2 | 2/2014 | Tufty et al. |
| 8,934,244 B2 | 1/2015 | Shelnutt et al. |
| 8,953,317 B2 | 2/2015 | Campbell et al. |
| 9,049,800 B2 | 6/2015 | Shelnutt et al. |
| 9,051,502 B2 | 6/2015 | Sedarous et al. |
| 9,086,859 B2 | 7/2015 | Tufty et al. |
| 9,128,681 B2 | 9/2015 | Tufty et al. |
| 9,144,179 B2 | 9/2015 | Shelnutt et al. |
| 9,155,230 B2 | 10/2015 | Eriksen |
| 9,176,547 B2 | 11/2015 | Tufty et al. |
| 9,195,282 B2 | 11/2015 | Shelnutt et al. |
| 9,223,360 B2 | 12/2015 | Tufty et al. |
| 9,328,964 B2 | 5/2016 | Shelnutt et al. |
| 9,335,802 B2 | 5/2016 | Shelnutt et al. |
| 9,351,429 B2 | 5/2016 | Shelnutt et al. |
| 9,382,914 B1 | 7/2016 | Sharfi |
| 9,426,927 B2 | 8/2016 | Shafer et al. |
| 9,436,235 B2 | 9/2016 | Damaraju et al. |
| 9,464,854 B2 | 10/2016 | Shelnutt et al. |
| 9,529,395 B2 | 12/2016 | Franz et al. |
| 9,699,938 B2 | 7/2017 | Shelnutt et al. |
| 9,699,939 B2 | 7/2017 | Smith |
| 9,717,166 B2 | 7/2017 | Eriksen |
| 9,756,766 B2 | 9/2017 | Best |
| 9,773,526 B2 | 9/2017 | Shelnutt et al. |
| 9,781,859 B1 | 10/2017 | Wishman et al. |
| 9,795,065 B2 | 10/2017 | Shelnutt et al. |
| 9,839,164 B2 | 12/2017 | Shelnutt et al. |
| 9,844,166 B2 * | 12/2017 | Shelnutt .................. F28F 27/02 |
| 9,921,622 B2 | 3/2018 | Shelnutt et al. |
| 9,968,010 B2 | 5/2018 | Shelnutt et al. |
| 9,992,914 B2 | 6/2018 | Best et al. |
| 10,010,013 B2 | 6/2018 | Shelnutt et al. |
| 10,018,425 B2 | 7/2018 | Shelnutt et al. |
| 10,020,242 B2 | 7/2018 | Katsumata et al. |
| 10,064,314 B2 | 8/2018 | Shelnutt et al. |
| 10,104,808 B2 | 10/2018 | Scharinger et al. |
| 10,130,008 B2 | 11/2018 | Shepard et al. |
| 10,143,113 B2 | 11/2018 | Shelnutt et al. |
| 10,143,114 B2 | 11/2018 | Shelnutt et al. |
| 10,146,231 B2 | 12/2018 | Shelnutt et al. |
| 10,149,408 B2 | 12/2018 | Fujiwara et al. |
| 10,156,873 B2 | 12/2018 | Shelnutt et al. |
| 10,172,262 B2 | 1/2019 | Shelnutt et al. |
| 10,206,312 B2 | 2/2019 | Shelnutt et al. |
| 10,212,857 B2 | 2/2019 | Eriksen |
| 10,225,958 B1 | 3/2019 | Gao |
| 10,238,010 B2 | 3/2019 | Shelnutt et al. |
| 10,271,456 B2 | 4/2019 | Tufty et al. |
| 10,321,609 B2 | 6/2019 | Hirai et al. |
| 10,331,144 B2 | 6/2019 | Shelnutt et al. |
| 10,399,190 B2 | 9/2019 | North et al. |
| 10,542,635 B2 | 1/2020 | Nishiyama |
| 10,598,441 B2 | 3/2020 | Kawabata et al. |
| 10,617,042 B2 | 4/2020 | Shelnutt et al. |
| 10,622,283 B2 | 4/2020 | Leobandung |
| 10,624,236 B2 | 4/2020 | Inano et al. |
| 10,624,242 B2 | 4/2020 | Best |
| 10,638,641 B2 | 4/2020 | Franz et al. |
| 10,645,841 B1 | 5/2020 | Mao et al. |
| 10,653,036 B1 | 5/2020 | Gao |
| 10,667,434 B1 | 5/2020 | Mao et al. |
| 10,674,641 B2 | 6/2020 | Shepard et al. |
| 10,716,238 B2 | 7/2020 | Brink |
| 10,729,039 B2 | 7/2020 | Shelnutt et al. |
| 10,791,647 B1 | 9/2020 | Miyamura et al. |
| 10,809,011 B2 | 10/2020 | Chu et al. |
| 10,871,807 B2 | 12/2020 | Best et al. |
| 10,888,032 B2 | 1/2021 | Wakino et al. |
| 10,917,998 B2 | 2/2021 | Shelnutt et al. |
| 10,932,390 B2 | 2/2021 | Korikawa |
| 10,939,580 B2 | 3/2021 | Gao |
| 10,939,581 B1 | 3/2021 | Chen et al. |
| 10,990,144 B2 | 4/2021 | Wang et al. |
| 11,006,547 B2 | 5/2021 | Gao |
| 11,032,939 B2 | 6/2021 | Tufty et al. |
| 11,071,238 B2 | 7/2021 | Edmunds et al. |
| 11,107,749 B2 | 8/2021 | Taniguchi et al. |
| 11,268,739 B2 * | 3/2022 | Wang .................... F25B 41/24 |
| 11,572,614 B2 | 2/2023 | Sakamoto et al. |
| 11,751,359 B2 * | 9/2023 | Heydari ............ H05K 7/20272 |
| | | 361/699 |
| 11,822,398 B2 * | 11/2023 | Heydari .................. G06F 1/206 |
| 2002/0159233 A1 | 10/2002 | Patel et al. |
| 2004/0244947 A1 | 12/2004 | Chen |
| 2005/0150637 A1 | 7/2005 | Tan et al. |
| 2005/0248922 A1 | 11/2005 | Chu et al. |
| 2007/0227756 A1 | 10/2007 | Doerr et al. |
| 2009/0146294 A1 | 6/2009 | Hillman et al. |
| 2009/0205590 A1 | 8/2009 | Vetrovec |
| 2009/0260777 A1 | 10/2009 | Attlesey |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | St Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |

(56) References Cited

U.S. PATENT DOCUMENTS

| | | |
|---|---|---|
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | Wei et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1* | 3/2020 | Enright .............. H05K 7/20381 |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 107643813 A | 1/2018 |
| CN | 110691490 A | 1/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

Office Action with regard to the counterpart U.S. Appl. No. 17/697,452 mailed Nov. 22, 2023.

Office Action with regard to the counterpart U.S. Appl. No. 17/698,480 mailed Sep. 7, 2023.

Notice of Allowance with regard to the counterpart U.S. Appl. No. 17/691,494 mailed Apr. 17, 2023.

International Search Report and Written Opinion with regard to PCTIB2022053071 mailed Jun. 28, 2022.

International Search Report and Written Opinion with regard to PCT/IB2022/052975 mailed Jun. 20, 2022.

International Search Report and Written Opinion with regard to PCTIB2022052330 mailed May 30, 2022.

International Search Report and Written Opinion with regard to PCT/IB2022/052976 mailed Jun. 17, 2022.

International Search Report and Written Opinion with regard to PCT/IB2022/052977 mailed Jun. 20, 2022.

European Search Report with regard to EP21306170.8 completed Feb. 12, 2022.

European Search Report with regard to EP21306189.8 completed Feb. 10, 2022.

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.

"IBM's Hot-Water Supercomputer Goes Live", Data Center Knowledge, retrieved on Jul. 19, 2021, 9 pages.

Extended European Search Report with regard to the EP Patent Application No. 21306771.3 completed May 23, 2022.

Extended European Search Report with regard to the EP Patent Application No. 21306173.2 completed Feb. 18, 2022.

Extended European Search Report with regard to the EP Patent Application No. 21306174.0 completed Feb. 14, 2022.

Extended European Search Report with regard to the EP Patent Application No. 21306172.4 completed Feb. 15, 2022.

English Abstract for JP2020065002 retrieved on Espacenet on Jun. 2, 2022.

Extended European Search Report with regard to the EP Patent Application No. 21306186.4 completed Feb. 10, 2022.

Extended European Search Report with regard to the EP Patent Application No. 21306187.2 completed Feb. 10, 2022.

Extended European Search Report with regard to the EP Patent Application No. 21306175.7 completed Apr. 8, 2022.

Extended European Search Report with regard to the EP Patent Application No. 21306188.0 completed Feb. 10, 2022.

English Abstract for JPH043451 retrieved on Feb. 22, 2022.

Extended European Search Report with regard to the EP Patent Application No. 21306171.6 completed Feb. 11, 2022.

Extended European Search Report with regard to the EP Patent Application No. 21306189.8 completed Feb. 10, 2022.

Extended European Search Report with regard to the EP Patent Application No. 21306170.8 completed Feb. 12, 2022.

(56) References Cited

OTHER PUBLICATIONS

English Abstract for NL1006486 retrieved on Espacenet on Jun. 3, 2022.
Office Action with regard to the counterpart U.S. Appl. No. 17/697,452 mailed May 11, 2023.
Extended European Search Report with regard to the counterpart EP Patent Application No. 22305018.8 completed Jun. 24, 2022.
Office Action with regard to the counterpart U.S. Appl. No. 17/701,422 mailed Mar. 28, 2023.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Notice of Allowance with regard to the counterpart U.S. Appl. No. 17/690,839 mailed Mar. 5, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Office Action with regard to te counterpart U.S. Appl. No. 17/698,480 issued Jul. 3, 2024.
Office Action with regard to te counterpart CN Patent Application No. 2022103375051 issued May 11, 2024.
Office Action with regard to te counterpart U.S. Appl. No. 17/690,839 issued Jun. 25, 2024.
Notice of Allowance with regard to te counterpart U.S. Appl. No. 17/697,616 issued Jul. 23, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Notice of Allowance with regard to the counterpart U.S. Appl. No. 17/707,200 issued Aug. 15, 2024.

\* cited by examiner

FIG. 8 ns will thus require different volumes of the immersion cooling liquid. In some cases, the electronic component takes up a small amount of the volume within the immersion case thus requiring relatively larger volume of the immersion cooling liquid to fill the immersion case to a predetermined level. However, the immersion cooling liquid is an expensive component of conventional immersion systems. Therefore, Developers have noted that it may be advantageous to minimize a volume of the immersion cooling liquid for cost purposes whilst meeting a minimum requirement to achieve an adequate cooling of the electronic component.

IMMERSION COOLING SYSTEMS FOR ELECTRONIC COMPONENTS

CROSS-REFERENCE TO RELATED APPLICATION

The present patent application claims priority to European Patent Application Number 21305427.3 filed on Apr. 1, 2021, and to European Patent Application No. 21306172.4 filed on Aug. 30, 2021, the entirety of each of which is incorporated by reference herein.

TECHNICAL FIELD

The present technology relates to immersion cooling systems for cooling of electronic components of electronic equipment in computing infrastructures, and more specifically, but not limited to, immersion cooling systems in which a level of the immersion fluid can be modulated.

BACKGROUND

Electronic equipment, for example servers, memory banks, computer discs, and the like, is conventionally grouped in equipment racks. Large data centers and other large computing infrastructures may contain thousands of racks supporting thousands or even tens of thousands of servers and other electronic equipment.

The electronic equipment mounted in the racks consume large amounts of electric power and generates significant amounts of heat. Cooling needs are important in such racks. Some electronic equipment, such as processors, generate so much heat that they could fail within seconds in case of a lack of cooling. Moreover, with advancing technological progress, electronic equipment for computing purposes is not only becoming more performant but also has a greater associated thermal design power (TDP) (i.e., a maximum amount of heat generated thereby which a cooling system should dissipate) thus emphasizing the need to improve cooling solutions.

Forced air-cooling has been traditionally used to disperse heat generated by such electronic equipment mounted in the racks. Air-cooling requires the use of powerful fans, and the provision of space between the electronic equipment or between electronic components of a given electronic equipment. The space is used for placing heat sinks and for allowing sufficient airflow. However, such forced air-cooling methods are generally not very efficient.

Liquid-cooling technologies are increasingly used as an efficient and cost-effective solution to maintain safe operating temperatures of electronic equipment, such as servers, mounted in racks. Such liquid-cooling technologies include immersion cooling systems in which the electronic component is submerged in an immersion cooling liquid within an immersion case.

It is an object of the present technology to provide improvements to conventional immersion cooling systems.

SUMMARY

Developers have noted certain drawbacks in conventional immersion cooling system.

For example, there exist different types and combinations of electronic components having different cooling requirements and requiring different volumes of the immersion cooling liquid to achieve the cooling requirements. Such different types and combinations of the electronic compo- Furthermore, Developers have noted that it would be convenient to be able to quickly and efficiently modulate the level of the immersion cooling liquid within an immersion case, such as during transportation of the immersion case particularly in cases where the immersion case is not sealed. Being able to modulate the level of the immersion cooling liquid could also provide more ready access to the electronic component which is submerged in the immersion cooling liquid without requiring draining of the immersion cooling liquid.

It is an object of the present technology to ameliorate at least some of the inconveniences present in the prior art.

Broadly, aspects of the cooling system of the present technology provide a bladder configurable between an expanded state and a contracted state and which can be disposed in an immersion case configured to receive an electronic component and immersion cooling liquid, the immersion cooling liquid cooling the electronic component. Modulation of the bladder between the expanded and contracted states modulates a volume of the bladder within the immersion cooling liquid in use, thus enabling a modulation of a level of the immersion cooling liquid in use. A controller can modulate the state of the bladder to change immersion cooling liquid fluid level so as to effectively submerge the electronic component or to reduce fluid level in the immersion case.

Accordingly, embodiments of the present technology can provide an efficient way of modulating a level of the immersion cooling fluid in the immersion case, such as during transportation of the immersion case when the level can be reduced to avoid spillage of the valuable immersion cooling fluid. Advantageously, embodiments of the present technology can also modulate a volume of the immersion cooling liquid required to effectively cool an electronic component. More specifically, the bladder of the present technology can reduce a volume of the immersion cooling liquid within an immersion case.

According to one aspect of the present technology, there is provided a cooling system including an immersion case, a bladder and a controller. The immersion case is configured to house an immersion cooling liquid, and an electronic component configured to be submerged in the immersion cooling liquid. The bladder is configurable between an expanded state and a contracted state and positioned such that the bladder can be at least partially submerged in the immersion cooling liquid when in the expanded state and the bladder can be at least partially submerged in the immersion cooling liquid when in the contracted state. The controller connected to the bladder for modulating the bladder between the expanded state and the contracted state to modulate a fluid level of the immersion cooling liquid in the immersion case.

In some embodiments, the bladder includes at least one fold, the at least one fold being unfolded in the expanded state and folded in the contracted state.

In some embodiments, the bladder is made of a material which is thermally resistant up to at least 60° C.

In some embodiments, the bladder is configured to be anchored to the immersion case such that the bladder remains at least partially submerged in the immersion cooling liquid when in the expanded state and the contracted state, the bladder is submerged in the immersion cooling liquid when in the expanded state only, or the bladder contacts the electronic component in at least one of the expanded state and the contracted state.

In some embodiments, the bladder is configured to be anchored to the immersion case such that the bladder is fully submerged in the immersion cooling liquid when in the expanded state only.

In some embodiments, the bladder is not anchored to the immersion case and is configured to house a fluid which is more dense than the immersion cooling liquid for remaining at least partially submerged in the immersion cooling liquid when in the expanded state and the contracted state.

In some embodiments, the bladder is disposed in the immersion case such that it contacts the electronic component in at least one of the expanded state and the contracted state and is configured to draw heat away from the electronic component.

In some embodiments, the bladder is configured to house a bladder fluid, the bladder fluid being a gas or a liquid, and the cooling system including a pump communicatively connected to the controller and fluidly connected to the bladder, the pump being configured to move the bladder fluid in and out of the bladder.

In some embodiments, the reservoir is fluidly connected to the pump.

In some embodiments, the cooling system further includes a level sensor configured to detect the level of the immersion cooling liquid in the immersion case.

In some embodiments, the controller is communicatively connected to the level sensor and to the pump, the controller being configured to control the bladder state in response to data received from the level sensor.

In some embodiments, the bladder includes a plurality of bladders which are fluidly connected to one another.

In some embodiments, the cooling system further includes a rack system configured to receive the immersion case.

In some embodiments, when one of the rack system and the immersion case is displaced, the controller modulates the bladder to the contracted state.

In some embodiments, the immersion case is configured such that when the bladder is in the expanded state, the level of the immersion cooling liquid is at a first level in the immersion case and the electronic component is fully submerged in the immersion cooling liquid. When the bladder is in the contracted state, the level of the immersion cooling liquid is at a second level in the immersion case, the second level being lower than the first level. In other embodiments, for example in case of removal of the immersion cooling liquid from the immersion case (e.g. during a leak or during transportation), the bladder may be used to compensate for a lowering of the level of the immersion cooling liquid by expanding to keep the immersion cooling liquid level even. In other words, the first and second level may be substantially equal.

In some embodiments, the controller, responsive to a detection of a lowering of the level of the immersion cooling liquid, is configured to cause the bladder to expand in order to maintain the level of the immersion cooling liquid.

In some embodiments, the immersion case is configured such that when the bladder is in the expanded state, the level of the immersion cooling liquid is at a first level in the immersion case and the electronic component is not fully submerged in the immersion cooling liquid; and when the bladder is in the contracted state, the level of the immersion cooling liquid is at a second level in the immersion case, the second level being lower than the first level, and the electronic component being fully submerged in the immersion cooling liquid at the second level. Uses of such embodiments include the use of a bladder to lower the level of the immersion cooling liquid when access to the electronic component is required.

According to another aspect of the present technology, there is provided a method for operating a cooling system. The cooling system includes an immersion case housing immersion cooling liquid, an electronic component, and a bladder. The method is executed by a processor of a computer system communicatively coupled to a controller of the cooling system. The method includes modulating the bladder between an expanded state and a contracted state. The bladder is positioned in the immersion case such that the bladder is at least partially submerged in the immersion cooling liquid when in any one of the expanded state and the contracted state to modulate a level of the immersion cooling liquid in the immersion case and to selectively submerge the electronic component.

In some embodiments, the method further includes detecting the level of the immersion cooling liquid in the immersion case or a volume of the bladder, and responsive to the detected level of the immersion cooling liquid being a predetermined level or the volume of the bladder being at a predetermined volume, causing the modulation of the bladder.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

It must be noted that, as used in this specification and the appended claims, the singular form "a", "an" and "the" include plural referents unless the context clearly dictates otherwise.

As used herein, the term "and/or" is to be taken as specific disclosure of each of the two specified features or components with or without the other. For example "A and/or B" is to be taken as specific disclosure of each of (i) A, (ii) B and (iii) A and B, just as if each is set out individually herein.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

The various Figures are not to scale.

DETAILED DESCRIPTION

Figure 1:
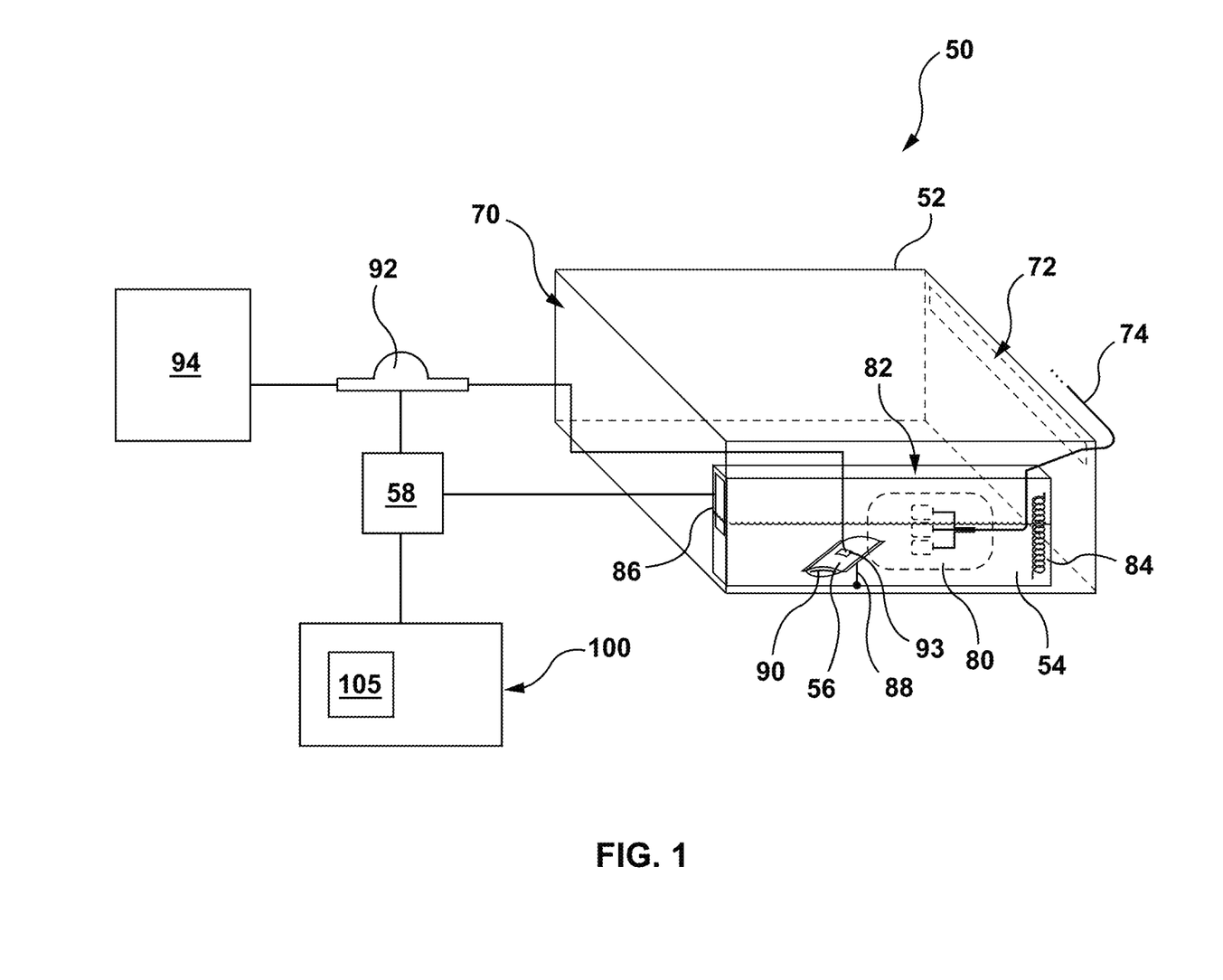
FIG. 1 is a perspective view taken from a front, top, left side of a cooling system in accordance to an embodiment of the present technology.

Referring to FIG. 1, according to a broad aspect of the present technology, there is provided a cooling system 50 which includes a rack system 52 and a plurality of immersion cases 54 (only one immersion case 54 is shown in the accompanying Figures). The cooling system 50 also includes a bladder 56 and a controller 58.

The rack system 52 defines a front opening 70, which in part, enables racking and de-racking operations of the immersion case 54. The rack system 52 also defines a rear opening 72 configured to accommodate a cable/tube bundle 74 therethrough. In some embodiments, the rear opening 72 could accommodate a plurality of cable/tube bundles 74 therethrough. The rack system 52 has a single shelf that is configured to house the plurality of immersion cases 54. In some embodiments, the rack system 52 could be configured to house a single immersion case 54. In other embodiments, the rack system 52 could have two or more shelves positioned substantially vertically in the rack system 52.

The immersion case 54 is configured to receive, and house, immersion cooling liquid and an electronic component 80 in a cavity therein. An upper aperture 82 is provided for access to the cavity. In other embodiments, access to the cavity of the immersion case 54 may be provided in a different manner such as from a side aperture or through a sealable portal. The electronic component 80, which can be submerged in the immersion cooling liquid, may, for example, comprise a server, a hard disk drive, a power supply, and the like. The immersion case 54 is also configured to receive and house a serpentine convection coil 84 therein. It is contemplated that in some embodiments, the serpentine convection coil 84 could be another type of heat exchanger. In some embodiments, the immersion case 54 could be configured to receive two or more electronic components 80 and/or two or more serpentine convection coils 84 therein. As will also be described below, the immersion cooling liquid can aid in cooling the electronic component 80 and in heat exchange through the serpentine convection coil 84. In other embodiments, the serpentine convention coil 84 may be omitted.

In certain embodiments, the cooling system 50 also includes a level sensor 86 that is connected to the immersion case 54 and that is communicatively connected to the controller 58. The level sensor 86 is configured to detect fluid level (i.e. height) of the immersion cooling liquid within the immersion case 54, and communicate said fluid level to the controller 58. In certain other embodiments, the cooling system 50 may omit the level sensor 86.

The cable/tube bundle 74 services the immersion case 54 by carrying hot and/or cold fluid and/or electrical current in and/or out the immersion case 54. In some embodiments, the fluid carried by the cable/tube bundles 74 is water. The cable/tube bundle 74 is operatively connected to water blocks (not shown) of the electronic component 80 and to the serpentine convection coil 84.

The bladder 56, which is configurable between an expanded state (FIG. 3) and a contracted state (FIG. 2), is disposed within the immersion case 54. It is understood that in some embodiments, the bladder 56 could be configured to states between the expanded and contracted states such as, for example, a partially contracted state. A volume occupied by the bladder 56 in the expanded state is more than a volume occupied by the bladder 56 in the contracted state. Thus, when the bladder 56 is at least partially submerged in the immersion cooling liquid, modulation of the fluid level can be achieved through modulation of a volume that the bladder 56 occupies in the immersion cooling liquid.

Figure 2:
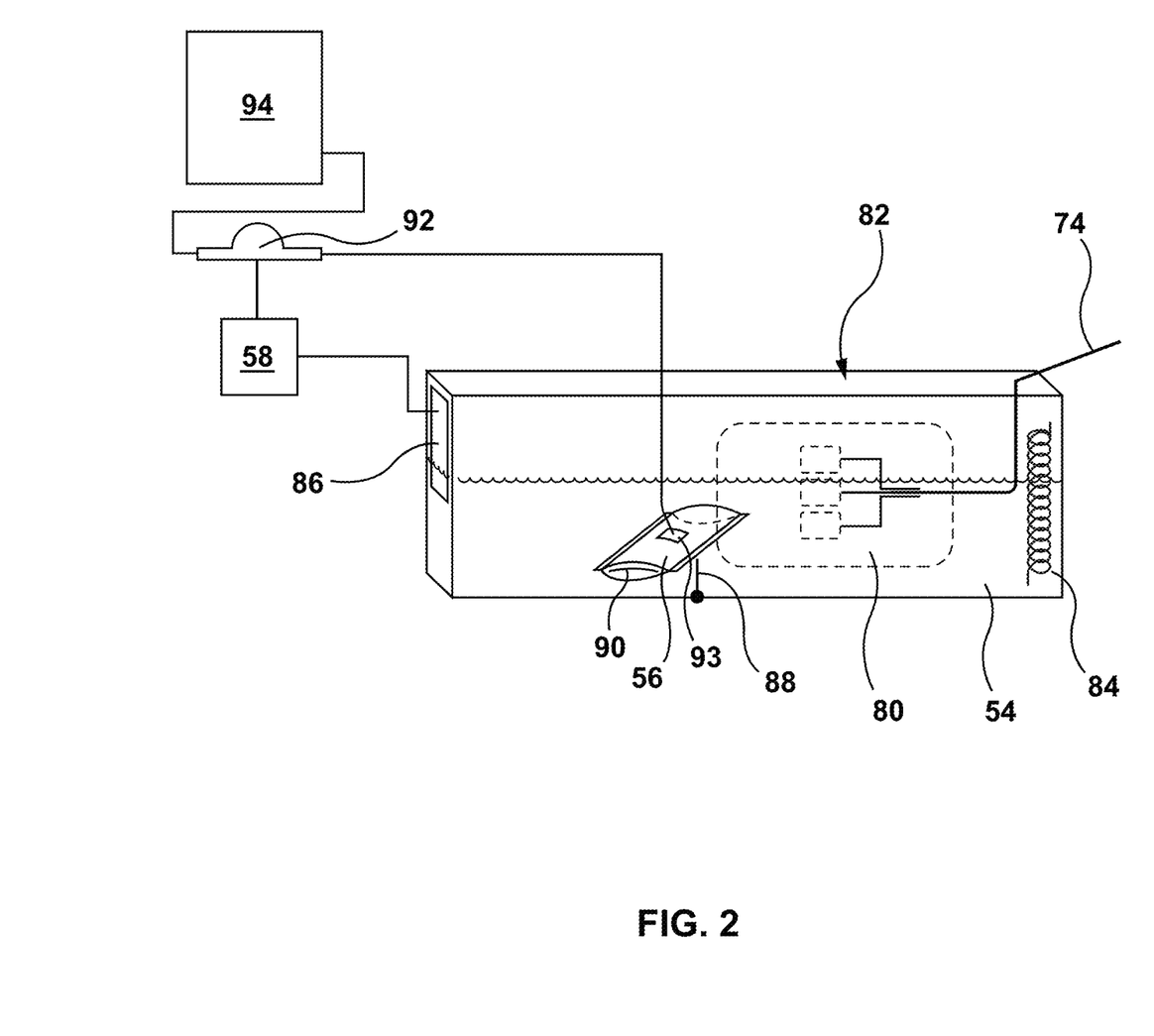
FIG. 2 is a perspective view taken from a top, left side of an immersion case of the cooling system of FIG. 1 with a bladder housed in the immersion case being in a contracted state.
Figure 3:
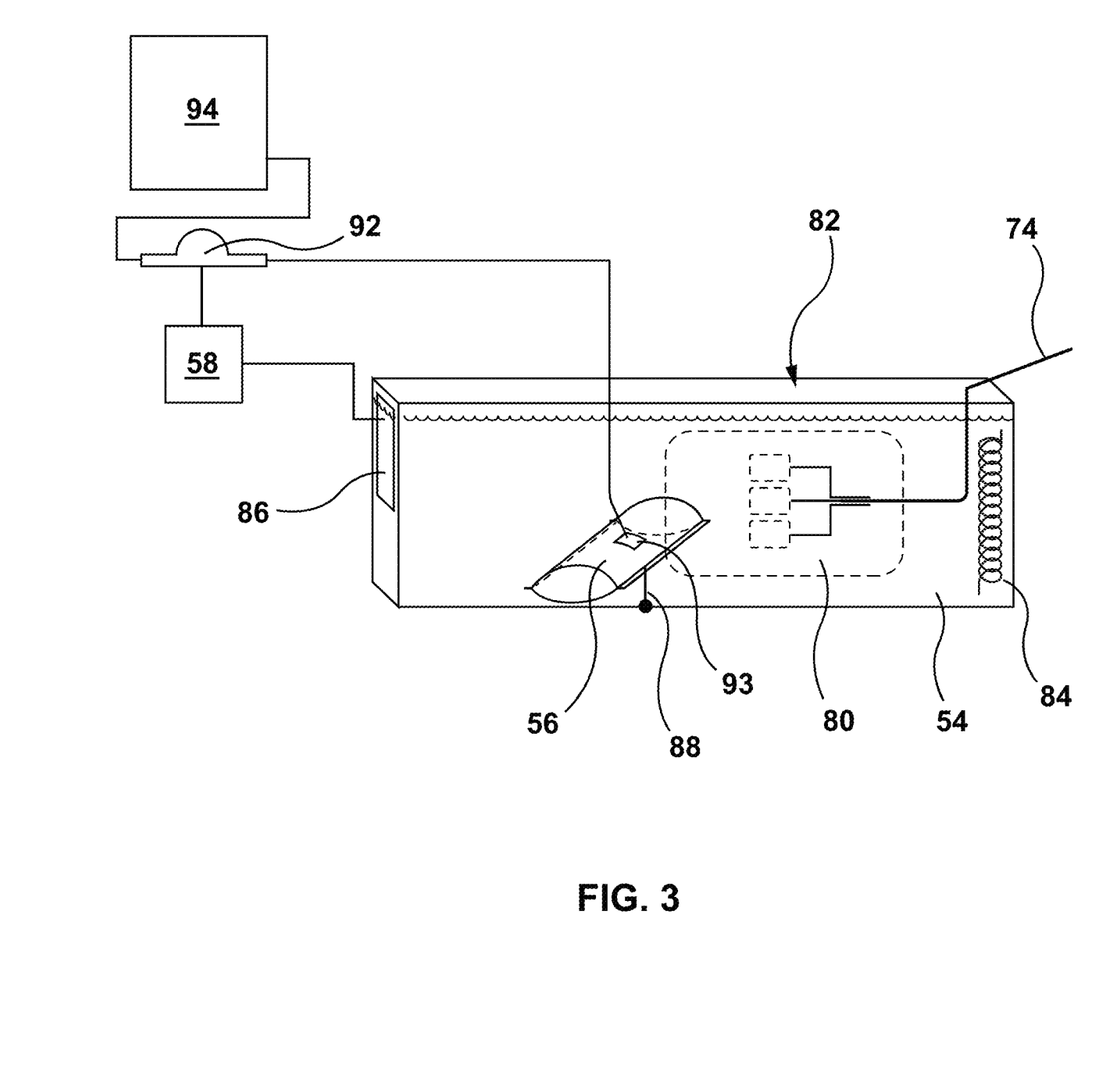
FIG. 3 is a perspective view taken from a top, left side of an immersion case of the cooling system of FIG. 1 with the bladder housed in the immersion case being in an expanded state.

More precisely, as shown in FIGS. 2 and 3, and as will be described in greater detail below, the bladder 56 is positioned such that the bladder 56 is fully submerged in the immersion cooling liquid when the bladder 56 is in the contracted state, and fully submerged in the immersion cooling liquid when the bladder 56 is in the expanded state. It is contemplated that in some embodiments, the bladder 56 could be partially submerged in the immersion cooling liquid when the bladder 56 is in the contracted state, and fully submerged in the immersion cooling liquid when the bladder 56 is in the expanded stated. In other embodiments, the bladder 56 could be partially submerged in the immersion cooling liquid when the bladder 56 is in the contracted state, and partially submerged in the immersion cooling liquid when the bladder 56 is in the expanded stated. In yet other embodiments, the bladder 56 could be fully submerged in the immersion cooling liquid when the bladder 56 is in the contracted state, and partially submerged in the immersion cooling liquid when the bladder 56 is in the expanded stated.

Furthermore, the bladder 56 is positioned in the immersion case 54 such that the bladder 56 does not contact the electronic component 80 when in the contracted state or the expanded state. In certain other embodiments, in the expanded state, a portion of the bladder 56 contacts a portion of the electronic component 80. As will be described in greater detail below, there could be heat transfer occurring between the bladder 56 and the electronic component 80.

The bladder 56 is anchored to a bottom wall of the immersion case 54 by a hook 88. It is contemplated that the bladder 56 could be anchored to the immersion case 54 by another connector such as a catch, a clasp, a latch, a clip or a grommet. It is also contemplated that in some embodiments, the bladder 56 could be anchored to another part of the immersion case 54, such as a side wall thereof or even to the serpentine convection coil 84. Anchoring the bladder 56 can help ensure that the bladder 56 remains, at least partially, submerged by the immersion cooling liquid when in the expanded state (i.e. does not float to the surface of the immersion cooling liquid). In other embodiments, the bladder 56 may not be anchored at all.

The bladder 56 is configured to house a bladder fluid therein. The bladder fluid may be a gas or a liquid. In some embodiments, the bladder fluid may be water. In other embodiments, the bladder fluid may be air. In yet other embodiments, the bladder fluid could be a coolant fluid to enhance heat transfer within the immersion case 54. As will be described in greater detail below, the bladder 56 is configured to expand to the expanded state when bladder fluid flows into the bladder 56 and is configured to contract to the contracted state when some bladder fluid flows out of the bladder 56. As will also be described below, in some embodiments, the bladder 56 could expand and contract without bladder fluid flowing in or out of the bladder 56.

The bladder 56 may have any expandable configuration which may comprise one or more folds. In certain embodiments, the bladder 56 is made of a material which is not elastically deformable and relies on unfolding of folds for volume expansion in the expanded state. In certain other embodiments, the bladder 56 is made of a material which is elastically deformable and relies predominantly on a stretching of the material for volume expansion in the expanded state.

Figure 4A:
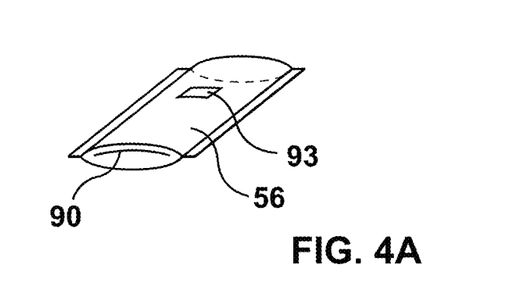
FIG. 4a is a perspective view taken from a top, left side of a bladder in accordance to an embodiment of the present technology, the bladder being in a contracted state.
Figure 4B:
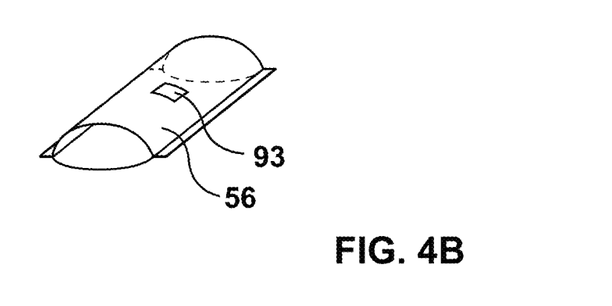
FIG. 4b is a perspective view taken from a top, left side of the bladder of FIG. 4b in an expanded state.

Referring to FIGS. 4*a* and 4*b*, an embodiment of the bladder 56 will now be described. The bladder 56 has walls that define a cavity configured to house the bladder fluid therein. The walls seal the cavity so that when the bladder 56 is filled with the bladder fluid, said bladder fluid does not mix with the immersion cooling liquid. The bladder 56 has folds 90 (only one shown in FIG. 4*a*) in the walls. The folds 90 can unfold in the expanded state, and can fold in the contracted state. The folds 90 may be formed on any part of the walls of the bladder 56. The bladder 56 has a port 93 for permitting flow of bladder fluid in and out of the cavity. In some embodiments, there could be two or more ports 93. When the bladder 56 is in the contracted state (FIG. 4*a*), the folds 90 are folded and the bladder 56 houses less bladder fluid than when the bladder 56 is in the expanded state (FIG. 4*b*). In some embodiments, the bladder 56 could house no bladder fluid in the contracted state. When the bladder 56 is in the expanded state (FIG. 4*b*), the folds 90 are unfolded, and the bladder 56 houses more bladder fluid than when the bladder 56 is in the contracted state.

In this embodiment, the bladder 56 increases in volume as it expands without elastically deforming. The bladder 56 is made from a non-elastically deformable material such as plastic. For example and without restriction, the non-elastically deformable material could be a mixture of polyethylene (PE) and polypropylene (PP) or a mixture of aluminium and PE. In addition, the non-elastically deformable material has a stiffness such that it does not crumple under pressure of the immersion cooling liquid. In other embodiments, the bladder 56 may be made of an elastically deformable material and may stretch when in the expanded state.

Figure 5A:
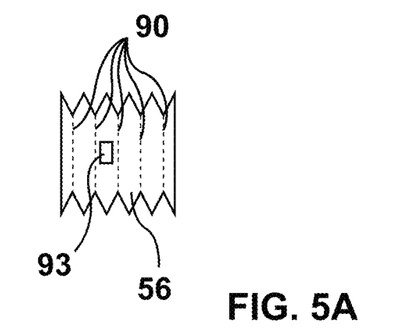
FIG. 5a is a left side elevation view of a bladder in accordance to an alternate embodiment of the present technology, the bladder being in a contracted state.
Figure 5B:
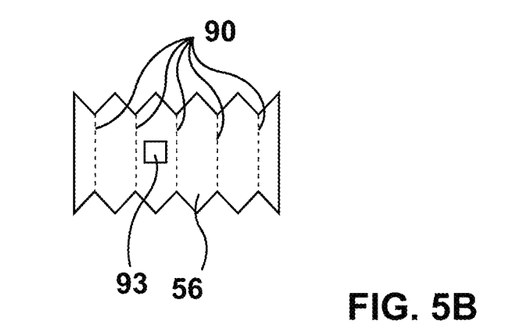
FIG. 5b is a left side elevation view of the bladder of FIG. 5a in an expanded state.

Referring to FIGS. 5*a* and 5*b*, an alternate embodiment of the bladder 56 will now be described. The bladder 56 has walls that define a cavity configured to house the bladder fluid therein. The walls seal the cavity so that when the bladder 56 is filled with the bladder fluid, said bladder fluid does not mix with the immersion cooling liquid. The bladder 56 has folds 90 that are configured as bellows. The bellows enable expansion and contraction of the bladder 56. The bladder 56 has a port 93 for permitting bladder fluid in and out of the cavity. In some embodiments, there could be two or more ports 93. When the bladder 56 is in the contracted state (FIG. 5*a*), the bellows are contracted and the bladder 56 houses less bladder fluid than when the bladder 56 is in the expanded state. In some embodiments, the bladder 56 may be empty of bladder fluid in the contracted state. When the bladder 56 is in the expanded state (FIG. 5*b*), the bellows are expanded and the bladder 56 houses more bladder fluid than when the bladder 56 is in the contracted state.

In this embodiment, the bladder 56 increases in volume as it expands without elastically deforming. The bladder 56 is made from a non-elastically deformable material such as plastic. For example and without restriction, the non-elastically deformable material could be a PE and PP mixture or an aluminium and PE mixture. In addition, the non-elastically deformable material has a stiffness such that it does not crumple under pressure of the immersion cooling liquid. In other embodiments, the bladder 56 may be made of an elastically deformable material and may stretch when in the expanded state.

Figure 6A:
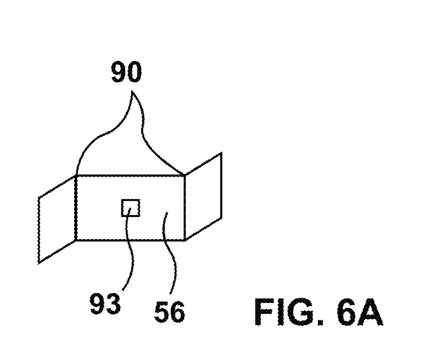
FIG. 6a is a perspective view taken from a top, left side of a bladder in accordance to an alternate embodiment of the present technology, the bladder being in a contracted state.
Figure 6B:
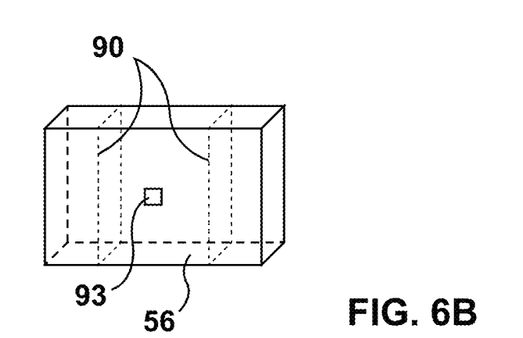
FIG. 6b is a perspective view taken from a top, left side of the bladder of FIG. 6a in an expanded state.

Referring to FIGS. 6*a* and 6*b*, an alternate embodiment of the bladder 56 will now be described. The bladder 56 has walls that define a cavity configured to house the bladder fluid therein. The walls seal the cavity so that when the bladder 56 is filled with the bladder fluid, said bladder fluid does not mix with the immersion cooling liquid. The bladder 56 has folds 90 of the bladder 56. The folds 90 can unfold in the expanded state, and can fold in the contracted state. The bladder 56 has a port 93 for permitting bladder fluid in and out of the cavity. In some embodiments, there could be two or more ports 93. When the bladder 56 is in the contracted state (FIG. 6*a*), the folds 90 are folded and the bladder 56 houses less bladder fluid than when in the expanded state. In some embodiments, the bladder 56 may be empty of bladder fluid in the contracted state. When the bladder 56 is in the expanded state (FIG. 6*b*), the folds 90 are unfolded, and the bladder 56 houses more fluid than when it is in the contracted state.

The bladder 56 increases in volume and elastically deforms as it expands. The bladder 56 is made from a material that is configured to elastically deform (e.g. similar to an inflated balloon) such as a polyvinyl chloride (PVC) and ethylene-vinyl acetate (EVA) mixture. The elastically deformable material is configured to not crumple under pressure of the immersion cooling liquid. Alternatively, the bladder 56 may omit the folds 90 and rely solely on material expansion for the volume increase.

Figure 7A:
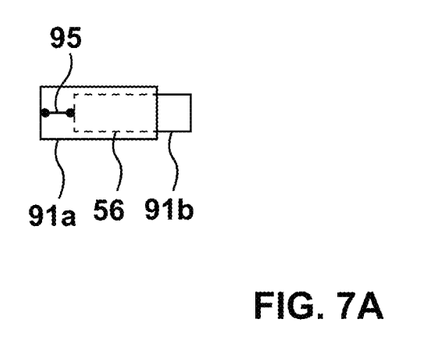
FIG. 7a is a left side elevation view of a bladder in accordance to an alternate embodiment of the present technology, the bladder being in a contracted state.
Figure 7B:
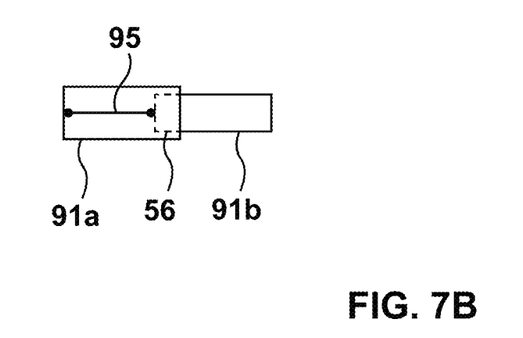
FIG. 7b is a left side elevation view of the bladder of FIG. 7a in an expanded state.

Referring to FIGS. 7*a* and 7*b*, an alternate embodiment of the bladder 56 will now be described in greater detail. The bladder 56 has an outer part 91*a* and an inner part 91*b*. The inner part 91*b* is partially received in the outer part 91*a* such that the bladder 56 has a telescopic configuration. In this embodiment, the bladder 56 is configured to expand and contract by an actuator 95 (i.e. the inner part 91*b* slides in and out of the outer part 91*a*). The actuator 95 could be, for example and without limitation, a hydraulic piston. The actuator 95 is communicatively connected to the controller 58. In this embodiment, the bladder 56 could house bladder fluid therein for heat transfer purposes (i.e. bladder fluid does not cause expansion or contraction).

Regardless of the configuration of the bladder 56 (i.e. whether it has folds and whether it is made of an elastically deformable material), the bladder 56 is configured to be thermally resistant up to an upper temperature reached by the immersion cooling liquid (e.g. at least 80° C.) and chemically resistant to the immersion cooling liquid. In other embodiments, the bladder 56 could be thermally resistant up to at least 70° C. In yet other embodiments, the bladder 56 could be thermally resistant up to at least 60° C.

It is contemplated that in some embodiments, the cooling system 50 could include two or more bladders 56. It is further contemplated that the two or more bladders could be fluidly connected to one another, or could be fluidly sealed from one another.

A size of the bladder 56 could vary from one embodiment to another. Indeed, in some embodiments, the electrical component 80 could be relatively large, such that a relatively large amount of immersion cooling liquid would be required to achieve a given fluid level in the immersion case 54. As immersion cooling liquid can be expensive, and in order to minimize a required volume of the immersion cooling liquid, a larger bladder 56 may be more suitable to help achieve the given fluid level. In some embodiments, the bladder 56 could be configured to expand to different volumes, such that a single bladder 56 could be suitable for smaller or larger electrical components 80. In certain embodiments, a set of bladders 56 may be provided, each having a different volume capacity.

The bladder 56 is fluidly connected to a pump 92 by the port 93. The pump 92 is fluidly connected to a reservoir 94, which is configured to contain the bladder fluid, and communicatively connected to the controller 58. The pump 92 is a hydraulic pump. In some embodiments, the pump 92 could be a manual pump. It is contemplated that the pump 92 could be another type of pump, such as, for instance, a pneumatic pump. The pump 92 is also communicatively connected to the controller 58. As will be described in greater detail below, the controller 58 is configured to operate the pump 92 to cause bladder fluid to flow in or out of the bladder 56.

In some embodiments, the cooling system 50 could have a conductivity sensor disposed within the immersion case 54 that could be communicatively connected to the controller 58. The conductivity sensor could, depending on the bladder fluid, help in detecting whether or not there is a leak in the bladder 56 by measuring conductivity of the fluid in which the conductivity sensor is disposed (i.e. conductivity of the fluid would increase or decrease depending on the bladder fluid). In other embodiments, the conductivity sensor could be a pH sensor.

It is contemplated that in some embodiments of the cooling system 50, the pump 92 and the reservoir 94 could be omitted. In such embodiments, the bladder 56 may be configured to expand or contract without causing bladder fluid to flow in or out of the bladder 56 (as shown in FIGS. 7a and 7b). In such embodiments, the actuator 95 is communicatively connected to the controller 58.

The cooling system 50 also includes a computer system 100. The computer system 100 includes a processor 105 that is communicatively connected to the controller 58. As such, the processor 105 is communicatively connected to the level sensor 86 and to the pump 92. It is contemplated that in some embodiments, the computer system 100 could be omitted.

Still referring to FIGS. 1 to 3, a description of the present technology in use will now be provided.

As shown in FIG. 1, the immersion case 54 is received in the rack system 52 through the front opening 70. The immersion case 54 houses the electronic component 80, the serpentine convection coil 84 and the bladder 56, which is in the contracted state. The immersion case 54 also houses the immersion cooling liquid, which is at a first fluid level when the bladder 56 is in the contracted state and at a second fluid level when the bladder 56 is in the expanded state, the second fluid level being higher than the first fluid level. The first fluid level is detected by the level sensor 86, and communicated to the controller 58 and to the processor 105. When the immersion cooling liquid is at the first fluid level, thus when the bladder 56 is in the contracted state, the electronic component 80, the serpentine convection coil 84 and the bladder 56 are only partially submerged by the immersion cooling liquid.

Then, when there is a need and/or a want to cool the electric component 80, the fluid level of the immersion cooling liquid can be increased. In response to a command provided to the controller 58 by the processor 105, the controller 58 is configured to operate the pump 92 to pump some bladder fluid from the reservoir 94 to the bladder 56. Moving bladder fluid into the bladder 56 results in the bladder 56 expanding such that a volume of the bladder 56 increases, which in turn results in the fluid level of the immersion cooling liquid increasing. In embodiments in which the bladder 56 includes the folds 90, as the bladder 56 expands, the folds 90 unfold. In some embodiments, the bladder 56 is configured to expand until the level sensor 86 detects that the immersion cooling liquid has reached a predetermined fluid level. In other embodiments, the bladder 56 could be configured to expand by a predetermined volume. In any case, the fluid level of the immersion cooling liquid increases because of the expansion of the bladder 56 until the second fluid level, higher than the first fluid level, is reached. When the immersion cooling liquid is at the second fluid level, thus when the bladder 56 is in the expanded state, the electronic component 80, the serpentine convection coil 84 and the bladder 56 are fully submerged by the immersion cooling liquid. The bladder 56 remains submerged in the immersion cooling liquid by the hook 88, which anchors the bladder 56, as, in some embodiments, depending on the material of the bladder 56 and/or density of the bladder fluid, the bladder 56 could float to a surface of the immersion cooling liquid.

In some embodiments, the controller 58 could be configured to operate the pump 92 in response to a predetermined set of conditions rather than a command. In some embodiments, the given predetermined set of conditions could be provided by the processor 105.

In other embodiments, as mentioned above, the controller 58 could be configured to modulate expansion or contraction of the bladder 56 without the pump 92 and the reservoir 94. Instead, when desired and/or needed, the controller 58 could actuate the actuator to cause expansion or contraction of the bladder 56.

When the immersion cooling liquid is at the second fluid level, hybrid cooling may occur. Cold water, or another fluid, may be carried by one of the tubes of the cable/tube bundle 74, and supplied to cooling blocks (not shown) mounted on the electronic component 80 to cool the electronic component 80. Subsequently, the water, which has increased in temperature but is expected to still be cooler than the immersion cooling liquid, is supplied to the serpentine convection coil 84. As the water flows through the serpentine convection coil 84, heat transfer between the serpentine convection coil 84 and the immersion cooling liquid induces convection of the immersion cooling liquid within the immersion case 54. The water then exits the serpentine convection coil 84 through another one of the tubes of the cable/tube bundle 74. Mounting the serpentine convention coil 84 upstream of the electronic component 80 along the path of the supplied water is also contemplated.

As shown in FIG. 3, in certain embodiments, when the bladder 56 is in the expanded state, the bladder 56 is positioned to contact a portion of the electrical component 80. In some embodiments, this contact and/or the presence of the bladder 56 can help cool the electronic component 80 and/or enhance convection of the immersion cooling liquid.

In other embodiments, and referring back to FIGS. 1 and 2, the bladder 56 could be used to reduce the immersion cooling fluid level back to the first fluid level or to another fluid level below the second fluid level. Thus, in response to a command provided to the controller 58 by the processor 105, the controller 58 is configured to operate the pump 92 to pump some bladder fluid out of the bladder 56. In some embodiments, the command may not be provided be the processor 105. Moving bladder fluid out of the bladder 56 results in the bladder 56 contracting such that a volume of the bladder 56 decreases, which in turns results in the fluid level of the immersion cooling liquid decreasing. As the bladder 56 contracts, the folds 90 fold. In some embodiments, the bladder 56 is configured to contract until the level sensor 86 detects that the immersion cooling liquid has reached a predetermined fluid level. In other embodiments, the bladder 56 could be configured to contract to a predetermined volume. In any case, the fluid level of the immersion cooling liquid decreases until the first fluid level, or the other fluid level below the second fluid level, is reached.

In some instances, there may be a need to transport the immersion case 54. Having a lower fluid level can help to reduce chances of the immersion cooling fluid spilling out of the immersion case 54. In addition, when there is a need to access the electrical component 80, having a lower fluid level can facilitate access to the electrical component 80. Furthermore, reducing the amount of immersion cooling fluid required to submerge an electrical component 80 in a given immersion case 54 using the bladder 56, can help reduce costs of the cooling system 50. Additionally, the bladder 56 permits quick fluid level adjustment. This can be useful when swift adjustability is required.

Figure 8:
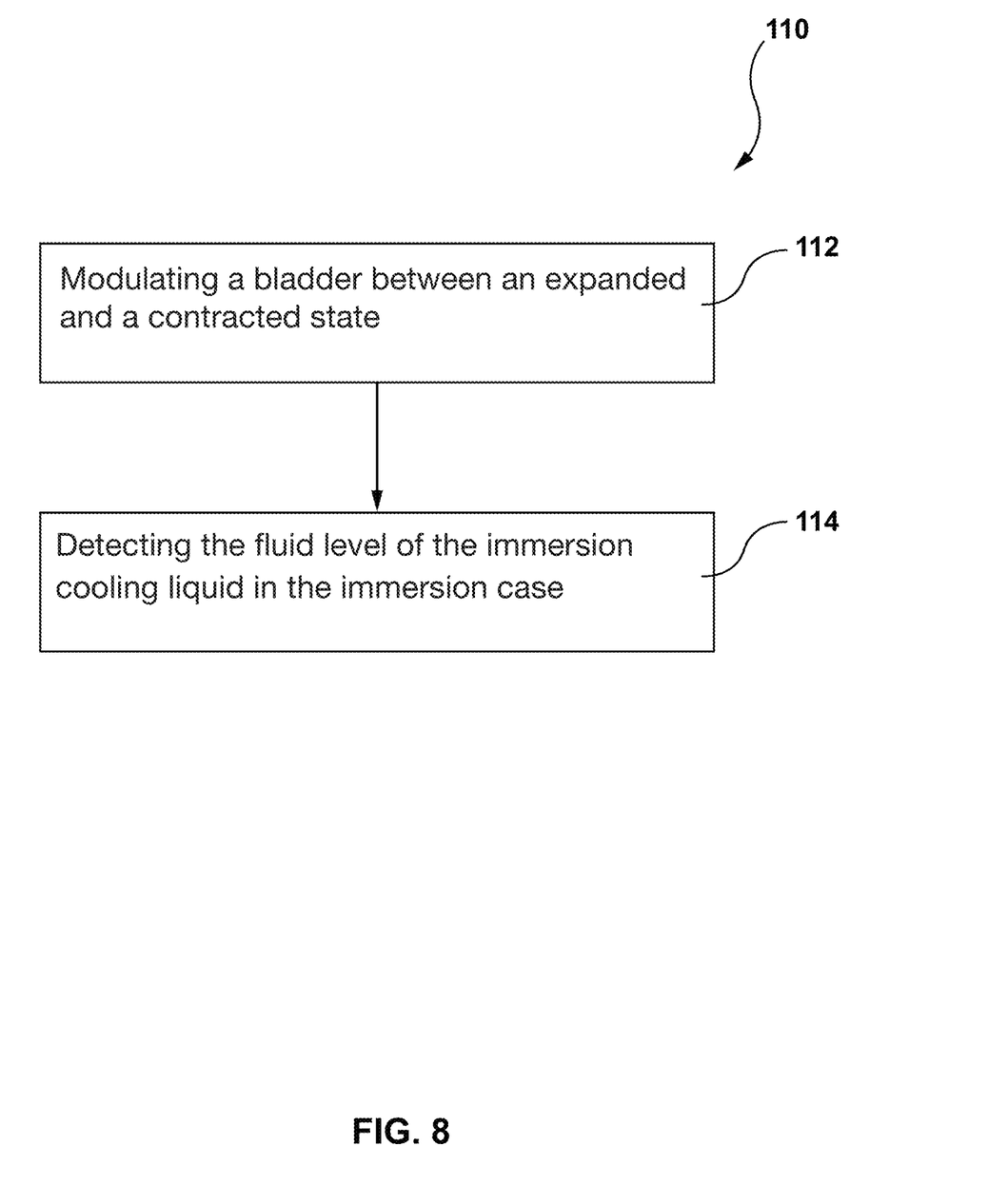
FIG. 8 is flowchart of a method for operating the cooling system of FIG. 1.

Referring to FIG. 8, a method 110 executed by the processor 105 of the computer system 100 will now be described. As mentioned above, the processor 105 is communicatively connected to the controller 58.

The method 110 begins at step 112 with the processor 105 detecting the fluid level of the immersion cooling liquid in the immersion case 54. The fluid level is detected by the level sensor 86, which communicates with the controller 58, which in turns communicates with the processor 105. In other embodiments, the fluid level of the immersion cooling liquid could be detected by detecting the volume of the bladder 56 and deriving the immersion cooling liquid fluid level therefrom. In response to the detected fluid level, the processor 105 is configured to cause modulation of the bladder 56.

Then, at step 114, the processor 105 is configured to modulate the bladder 56 between the expanded state and the contracted state by communicating commands with the controller 58, which in turns communicates with the pump 92 to modulate the bladder 56 between the expanded and contracted states.

Modifications and improvements to the above-described implementations of the present technology may become apparent to those skilled in the art. The foregoing description is intended to be exemplary rather than limiting. The scope of the present technology is therefore not intended to be limited by specificities of the shown examples.

The invention claimed is:

1. A cooling system for liquid immersion cooling of a heat-generating electronic component, comprising:
    an immersion case comprising:
        a top open aperture to receive and house immersion cooling liquid and the electronic component submerged in the immersion cooling liquid,
        a liquid level sensor configured to detect a height fluid level of the immersion cooling liquid within the immersion case,
        a bladder, containing a bladder fluid, configurable between an expanded state and a contracted state and positioned such that the bladder is at least partially submerged in the immersion cooling liquid when in the expanded state and the contracted state; and
    a controller operatively-coupled to the liquid level sensor and the bladder to modulate the bladder between the expanded state and the contracted state based on the detected height fluid level of the immersion cooling liquid to maintain the electronic component submerged within the immersion cooling liquid.

2. The cooling system of claim 1, wherein the bladder comprises at least one fold, the at least one fold being unfolded in the expanded state and folded in the contracted state.

3. The cooling system of claim 1, wherein the bladder is made of an elastically deformable material.

4. The cooling system of claim 1, wherein the bladder is made of a material which is thermally resistant up to at least 60° ° C.

5. The cooling system of claim 1, wherein the bladder is configured to be anchored to the immersion case such that the bladder remains at least partially submerged in the immersion cooling liquid when in the expanded state and the contracted state.

6. The cooling system of claim 1, wherein the bladder is configured to be anchored to the immersion case such that the bladder is fully submerged in the immersion cooling liquid when in the expanded state only.

7. The cooling system of claim 1, wherein the bladder is not anchored to the immersion case, and wherein the contained bladder fluid is denser than the immersion cooling liquid for remaining at least partially submerged in the immersion cooling liquid when in the expanded state and the contracted state.

8. The cooling system of claim 1, wherein the bladder is disposed in the immersion case such that it contacts the electronic component in at least one of the expanded state and the contracted state and is configured to draw heat away from the electronic component.

9. The cooling system of claim 1, wherein:
    the bladder fluid comprises a gas or a liquid; and
    the cooling system comprises a pump communicatively connected to the controller and fluidly connected to the bladder, the pump being configured to fluidly move the bladder fluid in and out of the bladder, in accordance with the controlled modulation of the bladder.

10. The cooling system of claim 9, further comprising a reservoir storing the bladder fluid and being fluidly connected to the pump.

11. The cooling system of claim 1, wherein the bladder comprises a plurality of bladders which are fluidly connected to one another.

12. The cooling system of claim 1, further comprising a rack system configured to receive the immersion case.

13. The cooling system of claim 12, wherein when one of the rack system and the immersion case is displaced, the controller modulates the bladder to the contracted state.

14. The cooling system of claim 1, wherein the immersion case is configured such that:
when the bladder is in the expanded state, the level of the immersion cooling liquid is at a first level in the immersion case and the electronic component is fully submerged in the immersion cooling liquid; and
when the bladder is in the contracted state, the level of the immersion cooling liquid is at a second level in the immersion case, the second level being lower than the first level.

15. The cooling system of claim 1, wherein the immersion case is configured such that:
when the bladder is in the expanded state, the level of the immersion cooling liquid is at a first level in the immersion case and the electronic component is not fully submerged in the immersion cooling liquid; and
when the bladder is in the contracted state, the level of the immersion cooling liquid is at a second level in the immersion case, the second level being lower than the first level, and the electronic component is fully submerged in the immersion cooling liquid.

16. The cooling system of claim 1, wherein the controller, responsive to a detection of a lowering of the level of the immersion cooling liquid, is configured to cause the bladder to expand in order to maintain the level of the immersion cooling liquid.

17. A method for liquid cooling of a heat-generating electronic component immersed in an open top immersion case containing an immersion cooling liquid, a bladder containing a bladder a fluid, and a liquid level sensor to detect a height fluid level of the immersion cooling liquid, the method executed by a controller operatively coupled to the liquid level sensor and the bladder for:
modulating the bladder between an expanded state and a contracted state based on the detected height fluid level of the immersion cooling liquid to maintain the electronic component submerged within the immersion cooling liquid.

18. The method of claim 17, wherein, the modulating of the bladder comprises
fluidly moving the bladder fluid in and out of the bladder, in accordance with the modulation of the bladder based on the detected height fluid level of the immersion cooling liquid.

* * * * *

UNITED STATES PATENT AND TRADEMARK OFFICE
CERTIFICATE OF CORRECTION

| | | |
|---|---|---|
| PATENT NO. | : 12,120,846 B2 | |
| APPLICATION NO. | : 17/694765 | |
| DATED | : October 15, 2024 | |
| INVENTOR(S) | : Ali Chehade et al. | |

It is certified that error appears in the above-identified patent and that said Letters Patent is hereby corrected as shown below:

In the Claims

Column 14, Claim 17, Line 9 should read --containing a bladder fluid, and a liquid level sensor to--.

Signed and Sealed this
Tenth Day of December, 2024

Katherine Kelly Vidal
*Director of the United States Patent and Trademark Office*